United States Patent
Kobayashi et al.

(10) Patent No.: US 8,421,314 B2
(45) Date of Patent: Apr. 16, 2013

(54) COMPOSITE SUBSTRATE, ELASTIC WAVE DEVICE USING THE SAME, AND METHOD FOR MANUFACTURING COMPOSITE SUBSTRATE

(75) Inventors: Hiroki Kobayashi, Chiryu (JP); Yuji Hori, Nagoya (JP); Yasunori Iwasaki, Kitanagoya (JP)

(73) Assignee: NGK Insulators, Ltd., Nagoya (JP)

( * ) Notice: Subject to any disclaimer, the term of this patent is extended or adjusted under 35 U.S.C. 154(b) by 192 days.

(21) Appl. No.: 12/714,666

(22) Filed: Mar. 1, 2010

(65) Prior Publication Data
US 2010/0244631 A1 Sep. 30, 2010

(30) Foreign Application Priority Data
Mar. 25, 2009 (JP) .................... 2009-075048

(51) Int. Cl.
*H01L 41/04* (2006.01)
(52) U.S. Cl.
USPC ..................................... 310/346; 310/313 A
(58) Field of Classification Search .................. 310/346, 310/313 R, 313 A, 313 B, 313 C, 313 D
See application file for complete search history.

(56) References Cited

U.S. PATENT DOCUMENTS

| 5,698,471 A * | 12/1997 | Namba et al. ................. 156/250 |
| 2006/0256167 A1 * | 11/2006 | Ifuku et al. ....................... 347/72 |
| 2007/0120623 A1 | 5/2007 | Sakiyama et al. |
| 2010/0141087 A1 * | 6/2010 | Bostan et al. ............ 310/313 D |

FOREIGN PATENT DOCUMENTS

JP 2007-150931 A1 6/2007

* cited by examiner

*Primary Examiner* — Derek Rosenau
(74) *Attorney, Agent, or Firm* — Burr & Brown

(57) ABSTRACT

A composite substrate is provided, including a piezoelectric substrate which is capable of transmitting an elastic wave, and a support substrate, which has a smaller thermal expansion coefficient than that of the piezoelectric substrate, bonded to each other. The in-plane maximum thermal strain amount, which is the largest thermal strain amount in the plane of the composite substrate, has a minimum value and a maximum value when the piezoelectric substrate and the support substrate are relatively rotated 0° to 360°, and the piezoelectric substrate and the support substrate are bonded to each other so that the in-plane maximum thermal strain amount has the minimum value or a value in the vicinity thereof.

7 Claims, 6 Drawing Sheets

COMPOSITE SUBSTRATE, ELASTIC WAVE DEVICE USING THE SAME, AND METHOD FOR MANUFACTURING COMPOSITE SUBSTRATE

FIELD OF THE INVENTION

The present invention relates to a composite substrate, an elastic wave device using the same, and a method for manufacturing a composite substrate.

BACKGROUND OF THE IVENTION

Hitherto, a surface acoustic wave device capable of functioning as a filter element or an oscillator used for a mobile phone or the like and an elastic wave device, such as a Lamb wave element or a thin film resonator (FBAR: Film Bulk Acoustic Resonator), using a piezoelectric thin film have been known. As the elastic wave devices described above, a device has been known which is formed in such a way that after a piezoelectric substrate which transmits an elastic wave and a support substrate having a smaller linear thermal expansion coefficient (hereinafter referred to as "thermal expansion coefficient") than that of this piezoelectric substrate are bonded to each other to form a composite substrate having a size of several inches, many comb-teeth electrodes are formed on this composite substrate using a photolithographic technique, and cutting is then performed by dicing. Since the change in size of the piezoelectric substrate caused by the change in temperature can be suppressed by using the composite substrate as described above, frequency characteristics as the elastic wave device can be stabilized. For example, in Patent Document 1, there has been proposed an elastic wave device having the structure in which an LT substrate (LT is an abbreviation of lithium tantalate) which is a piezoelectric substrate and a silicon substrate which is a support substrate are adhered to each other with an adhesive layer which is formed from an epoxy adhesive. After the elastic wave device as described above is mounted on a ceramic substrate by flip-chip bonding with gold balls interposed therebetween and is then encapsulated with a resin, this ceramic substrate is mounted on a printed circuit board using electrodes provided on a rear surface of the ceramic substrate with lead-free solder interposed therebetween. In addition, instead of using gold balls, the elastic wave device as described above may be mounted on a ceramic substrate with balls formed of lead-free solder in some cases. Also in this case, the lead-free solder is melted and re-solidified in a reflow step when mounting is performed.

Patent Document 1: JP 2007-150931 A

However, in a conventional elastic wave device, cracks are generated in some cases after the reflow step is finished, and there has been a problem in that the production yield is low. The reason the problem described above occurs is that, in a piezoelectric substrate and/or a support substrate having an anisotropic thermal expansion coefficient and an anisotropic elastic modulus (Young's modulus), a portion is present in which the difference in thermal expansion coefficient is large and the elastic modulus is low. That is, it is believed that in the portion as described above, since a large thermal stress is generated at a high temperature due the difference in thermal expansion coefficient, a thermal strain induced by this thermal stress is increased because of the low elastic modulus, and as a result, cracks are generated. In addition, also in a step other than the reflow step which is performed when an elastic wave device is mounted, a high-temperature process at a temperature of 250° C. to 300° C. may be performed in some cases on a composite substrate which still has a size of several inches, and in this case, cracks may also be generated by the same reason as described above.

SUMMARY OF THE INVENTION

The present invention has been conceived in consideration of the problems described above, and an object of the present invention is to provide a composite substrate which is used for an elastic wave device and which has superior heat resistance.

In order to attain the above object, the present invention takes the following means.

A composite substrate of the present invention is a composite substrate comprising: a piezoelectric substrate which has an anisotropy and which is capable of transmitting an elastic wave; and a support substrate which has an anisotropy and a smaller thermal expansion coefficient than that of the piezoelectric substrate and which is bonded thereto. In this composite substrate, an in-plane maximum thermal strain amount which is the largest thermal strain amount in the plane of the composite substrate has a minimum value and a maximum value when the piezoelectric substrate and the support substrate are relatively rotated 0° to 360°, and the piezoelectric substrate and the support substrate are bonded to each other so that the in-plane maximum thermal strain amount has the minimum value or a value in the vicinity thereof or so that the in-plane maximum thermal strain amount is in the range of from the minimum value to a value obtained by reducing the maximum value by 10%.

A method for manufacturing a composite substrate of the present invention is a method for manufacturing a composite substrate which comprises: boding a piezoelectric substrate which has an anisotropy and which is capable of transmitting an elastic wave and a support substrate which has an anisotropy and a smaller thermal expansion coefficient than that of the piezoelectric substrate. In the manufacturing method described above, an in-plane maximum thermal strain amount which is the largest thermal strain amount in the plane of the composite substrate has a minimum value and a maximum value when the piezoelectric substrate and the support substrate are relatively rotated 0° o 360°, and the piezoelectric substrate and the support substrate are bonded to each other so that the in-plane maximum thermal strain amount has the minimum value or a value in the vicinity thereof.

According to the composite substrate of the present invention, a large strain is not generated in a high-temperature treatment, and as a result, the generation of cracks is suppressed. In addition, according to the method for manufacturing a composite substrate of the present invention, the composite substrate as described above can be easily manufactured.

DETAILED DESCRIPTION OF THE INVENTION

In a composite substrate of the present invention, although a piezoelectric substrate is not particularly limited, for example, lithium tantalate (LT), lithium niobate (LN), single crystal of lithium niobate-lithium tantalate solid solution, quartz, lithium borate, zinc oxide, aluminum nitride, langasite (IRS), or langatate (LGT), each having at least one anisotropy of the thermal expansion coefficient and the Young's modulus, is preferable, and among those mentioned above, LT or LN is more preferable. The reason for this is that since having a fast transmission speed of a surface acoustic wave and a large electromechanical coupling factor, LT and Ln are each preferably used for a high-frequency and wide-band-frequency surface acoustic wave device.

In the composite substrate of the present invention, although a support substrate is not particularly limited, for example, silicon, sapphire, gallium arsenide, gallium nitride, or quartz, each having at least one anisotropy of the thermal expansion coefficient and the Young's modulus, is preferable, and among those mentioned above, silicon or sapphire is more preferable. The reason for this is that silicon and sapphire have been widely used in practice to form semiconductor devices. In addition, the thermal expansion coefficient of the support substrate is preferably smaller than that of the piezoelectric substrate by 10 ppm/K or more. The reason for this is that in the case described above, cracks are liable to be generated in heating due the large difference in thermal expansion coefficient between the above two substrates, and hence the application of the present invention is of great significance. For example, when the thermal expansion coefficient of the piezoelectric substrate is 13 to 20 ppm/K, as the support substrate, a substrate having a thermal expansion coefficient of 2 to 7 ppm/K is preferably used.

In the composite substrate of the present invention, although the piezoelectric substrate and the support substrate may be directly bonded to each other, the two substrates may be indirectly bonded to each other with an organic adhesive layer interposed therebetween. As a method for directly bonding the two substrates, the following method may be mentioned by way of example. That is, first, bonding surfaces of the two substrates are washed, so that impurities (oxides, adsorbed materials, and the like) adhered to the bonding surfaces are removed. Next, the bonding surfaces of the two substrates are irradiated with ion beams of an inert gas, such as argon, so that the bonding surfaces are activated as well as remaining impurities are removed. Subsequently, the two substrates are adhered to each other at roam temperature in vacuum. In addition, as a method for indirectly bonding the two substrates with an organic adhesive layer interposed therebetween, the following method may be mentioned by way of example. That is, first, the bonding surfaces of the two substrates are washed, so that impurities adhered to the bonding surfaces are removed. Next, an organic adhesive is uniformly applied to at least one of the bonding surfaces of the two substrates. Subsequently, after the two substrates are adhered to each other, when the organic adhesive is formed of a thermosetting resin, heating is performed for curing, and when the organic adhesive is a photocurable resin, light is radiated for curing. In the case in which the boding is indirectly performed using an organic adhesive layer interposed between the two substrates, the thickness of the organic adhesive layer is preferably set in the range of 0.1 to 1.0 μm. When the thickness of the organic adhesive layer is more than 1.0 μm, it is not preferable since the difference in thermal expansion coefficient between the piezoelectric substrate and the support substrate is absorbed by this organic adhesive layer, and an effect of suppressing the change in frequency characteristics with respect to the change in temperature cannot be easily obtained. In addition, when the thickness of the organic adhesive layer is less than 0.1 μm, it is not preferable since, by the influence of voids, the effect of suppressing the change in frequency characteristics with respect to the change in temperature cannot be easily obtained.

In the composite substrate of the present invention, an in-plane maximum thermal strain amount which is the largest thermal stain amount in the plane of the composite substrate has a minimum value and a maximum value when the piezoelectric substrate and the support substrate are relatively rotated 0° to 360°. The reason the in-plane maximum thermal strain amount changes as described above is that the piezoelectric substrate and the support substrate each have an anisotropy.

In the composite substrate of the present invention, although the way of change in in-plane maximum thermal strain amount which occurs when the piezoelectric substrate and the support substrate are relatively rotated 0° to 360° may be obtained by experiments, it may also be obtained by the simulation which will be described below.

In the composite substrate of the present invention, the piezoelectric substrate and the support substrate may be bonded to each other so that the in-plane maximum thermal strain amount has the minimum value or a value in the vicinity thereof. By this configuration, the generation of cracks in a high temperature treatment can be effectively suppressed. Incidentally, the vicinity of the minimum value means as follows. That is, for example, even if the in-plane maximum strain amount is set based on the design to have the minimum value, the in-plane maximum strain amount may deviate from the minimum value by errors made in manufacturing and the like, and hence the vicinity of the minimum value is the range set in consideration of the above deviation. In addition, the piezoelectric substrate and the support substrate may be bonded to each other so that the in-plane maximum thermal strain amount is in the range of from the minimum value to a value obtained by reducing the maximum value by 10%. Also in this case, the generation of cracks in a high temperature treatment can be relatively favorably suppressed.

The composite substrate of the present invention is used for an elastic wave device. As the elastic wave device, a surface acoustic wave device, a Lamb wave element, a thin film resonator (FEAR), or the like has been known. For example, the surface acoustic wave device is a device in which on a surface of a piezoelectric substrate, there are provided an input side IDT (interdigital transducer) electrode (also called a comb-teeth electrode or a reed screen electrode) for exciting a surface acoustic wave and an output side IDT electrode for receiving the surface acoustic wave. When a high frequency signal is applied to the input side IDT electrode, an electric field is generated between the electrodes, and the surface acoustic wave is excited and is transmitted on the piezoelectric substrate. Subsequently, from the output side IDT electrode provided in the transmission direction, the transmitted surface acoustic wave can be obtained as an electrical signal. When the elastic wave device as described above is mounted, for example, on a printed circuit board, a reflow step is used. In this reflow step, although the elastic wave device is heated to approximately 260° C. when lead-free solder is used, since an elastic wave device using the composite substrate of the present invention is superior in heat resistance, the generation of cracks is suppressed. In addition, although a composite substrate having a size of several inches may be directly treated in a high temperature process at a temperature of 250° C. to 300° C. in some cases, in this case, the generation of cracks can also be suppressed.

In the composite substrate of the present invention, the piezoelectric substrate may be provided with a metal film on the rear surface thereof. When a Lamb wave element is manufactured as the elastic wave device, the metal film functions to increase the electromechanical coupling factor in the vicinity of the rear surface of the piezoelectric substrate. In this case, the Lamb wave element has the structure in which comb-teeth electrodes are formed on the surface of the piezoelectric substrate, and in which the metal film provided on the piezoelectric substrate is exposed by a cavity formed in the support substrate. As a material for this metal film, for example, aluminum, an aluminum alloy, copper, or gold may be mentioned. In addition, when the Lamb wave element is manufactured, a composite substrate may also be used including a piezoelectric substrate provided with no metal film on the rear surface thereof.

In the composite substrate of the present invention, the piezoelectric substrate may be provided with a metal film and an insulating film on the rear surface thereof. The metal film functions as an electrode when a thin film resonator is manufactured as the elastic wave device. In this case, the thin film resonator has the structure in which since electrodes are formed on the front and the rear surfaces of the piezoelectric substrate, and the insulating film is used as a cavity, the metal film provided on the piezoelectric substrate is exposed. As a material for the metal film described above, for example, molybdenum, ruthenium, tungsten, chromium, or aluminum may be mentioned. In addition, as a material for the insulating film, for example, silicon dioxide, phosphorous silicate glass, or borophosphorous silicate glass may be mentioned.

EXAMPLES

Example 1

Figure 1:
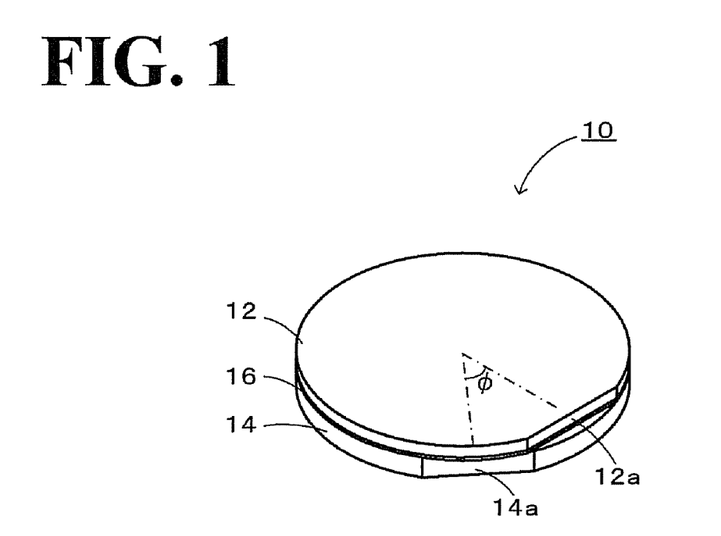
FIG. 1 is a perspective view of a composite substrate 10.

FIG. 1 is a perspective view of a composite substrate 10. This composite substrate 10 is used for a surface acoustic wave device and includes a piezoelectric substrate 12 composed of lithium tantalate (LT) capable of transmitting an elastic wave, a support substrate 14 composed of silicon and bonded to this piezoelectric substrate 12, and an adhesive layer 16 which bonds the two substrates 12 and 14. The piezoelectric substrate 12 has a thermal expansion coefficient of 16.1 ppm/K. This piezoelectric substrate 12 is a 42° Y-cut X-transmission LT substrate (42Y-X LT) that is rotated 42° from the Y axis to the Z axis about the X axis which is the transmission direction of a surface acoustic wave and has an orientation flat (hereinafter abbreviated as "orifla") 12a. The direction of the orifla 12a of the piezoelectric substrate 12 indicates the transmission direction (X axis) of a surface acoustic wave. The support substrate 14 has a thermal expansion coefficient of 2.55 ppm/K and has an orifla 14a. The direction of the orifla 14a of the support substrate 14 is the <110> axis and is deviated from the direction of the orifla 12a of the piezoelectric substrate 12 by an angle φ (in this case, approximately 45°). The adhesive layer 16 is a cured thermosetting epoxy resin, adhesive and has a thickness of 0.3 μm.

Figure 2A:
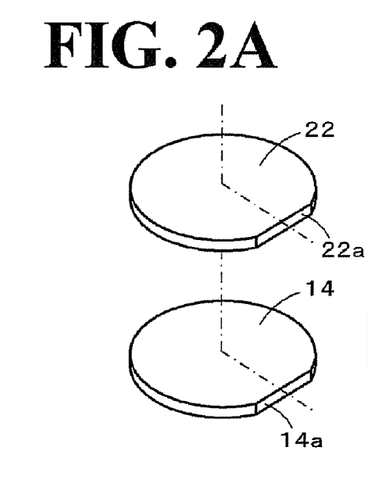
FIGS. 2A - 2D) are explanation views schematically showing the method for manufacturing the composite substrate 10.
Figure 2B:
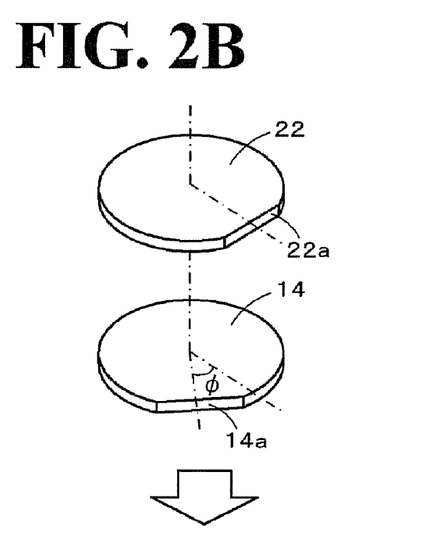
Figure 2C:
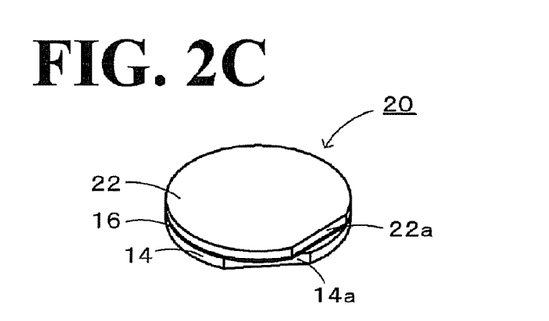
Figure 2D:
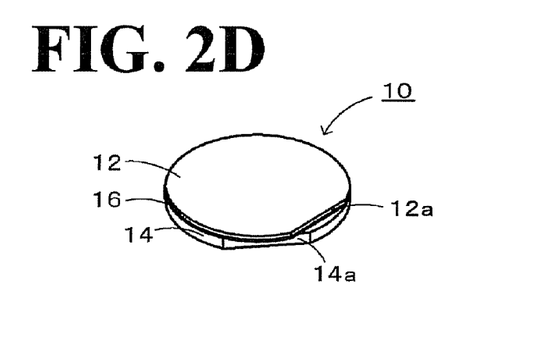

A method for manufacturing the composite substrate 10 as described above will be described with reference to Figs. 2A-2D, which are explanation views schematically showing the method for manufacturing the composite substrate 10. First, as the support substrate 14, a silicon substrate having the (100) plane direction is prepared. In addition, as a piezoelectric substrate 22 before polishing, a 42°Y-cut X-transmission LT substrate is prepared (see FIG. 2A). Subsequently, positioning is performed so that the direction of the orifla 14a of the support substrate 14 forms an angle φ with respect to the direction of an orifla 22a of the piezoelectric substrate 22 (see FIG. 2B). Next, after the rear surface of the piezoelectric substrate 22 is applied with a thermosetting epoxy resin adhesive by spin coating and is then adhered to the surface of the support substrate 14, the epoxy resin adhesive is cured by heating to 180° C., so that an adhered substrate (composite substrate before polishing) 20 is obtained (see FIG. 2C). The adhesive layer 16 of this adhered substrate 20 is formed by solidification of the epoxy resin adhesive. Next, the piezoelectric substrate 22 is polished by a polishing apparatus to have a thickness of 30 μm (see FIG. 2D). As the polishing apparatus, an apparatus which first decreases the thickness of the piezoelectric substrate 22 and then performs mirror polishing thereof is used. As a result, the piezoelectric substrate 22 before polishing is formed into the polished piezoelectric substrate 12, so that the composite substrate 10 is completed.

Figure 3:
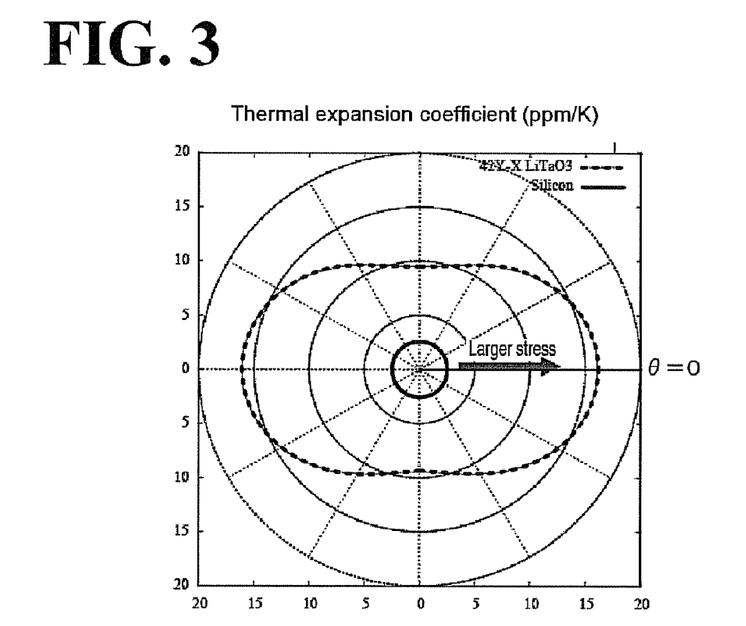
FIG. 3 shows in-plane distributions of the thermal expansion coefficients of a piezoelectric substrate 12 and a support substrate 14.
Figure 4:
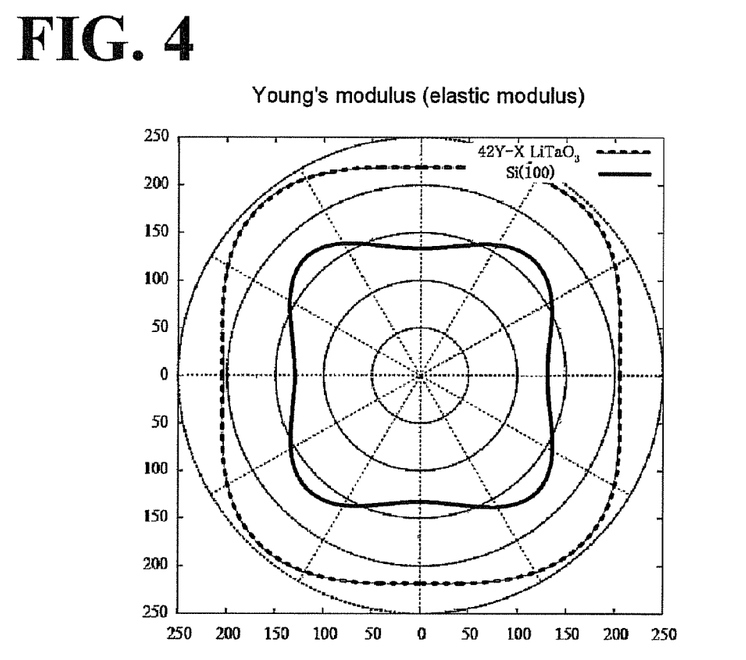
FIG. 4 shows in-plane distributions of the Young's moduli of the piezoelectric substrate 12 and the support substrate 14.

Next, an in-plane maximum thermal strain amount SH which is the largest thermal strain amount in the plane of the composite substrate 10 will be described. The in-plane distributions of the thermal expansion coefficients of the piezoelectric substrate 12 and the support substrate 14 are shown in FIG. 3, and the in-plane distributions of the Young's moduli (elastic moduli) thereof are shown in FIG. 4. The in-plane distributions shown in FIGS. 3 and 4 are obtained when the piezoelectric substrate 12 and the support substrate 14 are bonded to each other so that the direction of the orifla 12a of the piezoelectric substrate 12 and the direction of the orifla 14a of the support substrate 14 coincide with each other. As apparent from FIG. 3, although the piezoelectric substrate 12 has an anisotropic thermal expansion coefficient, the support substrate 14 has no anisotropic thermal expansion coefficient. Hence, at a position shown by the arrow in FIG. 3 and a position rotated 180° therefrom, the difference in thermal expansion coefficient between the two substrates 12 and 14 becomes maximum and a stress caused by the difference in thermal expansion coefficient becomes maximum. When an angle from the direction of the orifla 12a (direction perpendicular to the orifla 12a) of the piezoelectric substrate 12 to the direction at which the stress becomes maximum is represented by θ, and the direction of the orifla 12a is set so that θ is 0, since the direction (arrow) at which the stress becomes maximum coincides with the direction of the orifla 12a in FIG. 3, θ =0holds. On the other hand, as apparent from FIG. 4, since the two substrates 12 and 14 each have an anisotropic Young's modulus (elastic modulus), the Young's moduli of the piezoelectric substrate 12 and the support substrate 14 each have the minimum values in the direction of the orifla 12a and directions rotated every 90° therefrom. As described above, when the piezoelectric substrate 12 and the support substrate 14 are bonded to each other so that the directions of the two olifras 12a and 14a coincide with each other, the in-plane maximum thermal strain amount SH of the composite substrate 10 has the maximum value. The reason for this is that in this state, the stress is maximized, and the Young's moduli of the substrates 12 and 14 are minimized.

Figure 5:
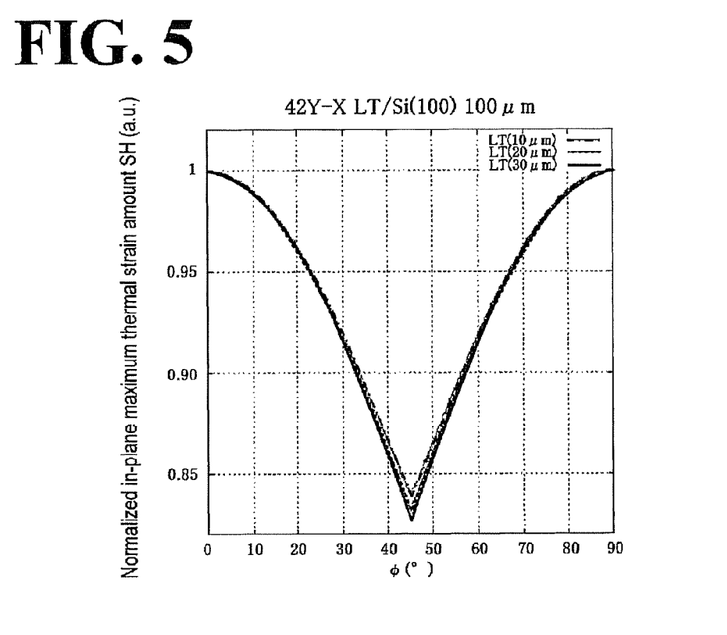
FIG. 5 is a graph showing variation in in-plane maximum thermal strain amount SH against angle φ in Example 1.

FIG. 5 shows the way of change in in-plane maximum thermal strain amount SH obtained by simulation in which the thickness of the support substrate 14 is set to 100 μm and the thickness of the piezoelectric substrate 12 is set to 10 μm, 20 μm, and 30 μm. The simulation was performed in accordance with the following procedure. That is, an elastic modulus E (θ, φ) of the composite substrate 10 is defined as shown by the following (equation 1) when the angles θ and φ described above are used. When the thickness of the support substrate 14 and that of the piezoelectric substrate 12 are represented by $t_B$ and $t_F$, respectively, contribution ratios $C_B$ and $C_F$ are ratios of the respective thicknesses $t_B$ and $t_F$ with respect to the total thickness ($t_B+t_F$). In addition, Young's moduli $E_B$ and $E_F$ are each a function of the angle and have been described in published documents (such as J. Kushibiki and Y. Ohashi, IEEE Trans. UFFC, Vol. 53, No. 2, pp. 385-392 (2006); J. Kushibiki, Y. Ohashi and J. Hirohashi, J. Appl. Phys., Vol. 98, p. 123507 (2005); W. A. Brantley, J. Appl. Phys., Vol. 44, p. 534 (1973); J. J. Wortman and R. A. Evance, J. Appl. Phys., Vol. 36, p. 153 (1965); and Hayashi, Tsujimoto, Okamoto, and Nishikawa, Zairyo (Materials), Vol. 41, p. 488 (1992)). On the other hand, a thermal stress σ(θ, T) of the composite substrate 10 is defined as shown by the following (Equation 2), and Δα(θ) of this (Equation 2) is defined as shown by the following (Equation 3). In addition, $\Delta\alpha_B(\theta)$ and $\Delta\alpha_F(\theta+\phi)$ are each a function of the angle and have been described in published documents (such as Elastic Wave Element Technology Handbook, edited by Elastic Wave Element Technology Committee No. 150, Japan Society for the Promotion of Science, published by Ohmsha, Ltd.). In addition, a thermal strain amount S(θ, φ) is defined by the following (Equation 4). The maximum value of this thermal strain amount S(θ, φ) in the plane of the composite substrate 10, that is, the in-plane maximum thermal strain amount SH, is defined by the following (Equation 5). Values of this in-plane maximum thermal strain amount SH are calculated at the angle φ in the range of 0° to 360°, so that the maximum value and the minimum value are obtained. In addition, the minimum value of the in-plane maximum thermal strain amount SH is defined by the following (Equation 6).

$$E_{(\theta,\phi)} = C_B E_B(\theta) + C_F E_F(\theta + \phi) \quad \text{Equation 1}$$

$$\begin{cases} E_{(\theta,\phi)}: \text{Elastic modulus of composite substrate} \\ C_B: \text{Contribution ratio of support substrate thickness} \\ C_F: \text{Contribution ratio of} \\ \quad \text{piezoelectric substrate thickness} \\ E_B: \text{Young's modulus of support substrate} \\ E_F: \text{Young's modulus of piezoelectric substrate} \end{cases}$$

$$\sigma_{(\theta,T)} = \Delta\alpha(\theta) \cdot \Delta T \cdot A \quad \text{Equation 2}$$

$$\begin{cases} \sigma_{(\theta,T)}: \text{Thermal stress of composite substrate} \\ \Delta\alpha(\theta): \text{Thermal expansion coefficient of} \\ \quad \text{composite substrate in } \theta \text{ direction} \\ \Delta T: \text{Increase in temperature} \\ A: \text{Material-inherent constant of proportion} \end{cases}$$

$$\Delta\alpha(\theta) = \alpha_B(\theta) - \alpha_F(\theta + \phi) \quad \text{Equation 3}$$

$$\begin{cases} \alpha_B(\theta): \text{Thermal expansion coefficient of} \\ \quad \text{support substrate in } \theta \text{ direction} \\ \alpha_F(\theta + \phi): \text{Thermal expansion coefficient of} \\ \quad \text{piezoelectric substrate in } \theta + \phi \text{ direction} \end{cases}$$

-continued $$S(\theta, \phi) = \frac{\sigma(\theta, T)}{E(\theta, \phi)} (S_{(\theta,\phi)}: \text{Thermal strain amount}) \quad \text{Equation 4}$$

$$SH = [|S(\theta, \phi)|]_\theta^{MAX} \quad \text{Equation 5}$$

$$\begin{cases} SH: \text{In-plane maximum thermal strain amount} \\ \text{Here, } [X]_\theta^{MAX} \text{ represents maximum} \\ \text{value of function } X \text{ of angle } \theta \end{cases}$$

$$\text{Minimum Value of } SH = [SH]_\phi^{MIN} \quad \text{Equation 6}$$

$$\begin{pmatrix} \text{Here, } [X]_\phi^{MIN} \text{ represents minimum} \\ \text{value of function } X \text{ of angle } \phi \end{pmatrix}$$

FIG. 5 is a graph showing the change in in-plane maximum thermal strain amount SH in which the horizontal axis indicates the angle φ and the vertical axis indicates a relative value obtained when the maximum value of the in-plane maximum thermal strain amount SH is normalized to "1". In addition, since the Young's moduli of the two substrates 12 and 14 change in 90° cycles (see FIG. 4), the in-plane maximum thermal strain amount SH also changes in the same cycles as described above, and hence the range of the angle φ on the horizontal axis is set to 0° to 90°. As apparent from FIG. 5, the in-plane maximum thermal strain amount SH has the maximum value and the minimum value, and the minimum value of the in-plane maximum thermal strain amount SH is reduced by 17% to 18% as compared to the maximum value thereof. In addition, when the simulation was performed in a manner similar to that described above in which the thickness of the support substrate 14 was set to 200 μm and 300 μm, a graph similar to that shown in FIG. 5 was obtained.

In the case in which the two substrates 12 and 14 were actually bonded to each other so that the in-plane maximum thermal strain amount SH had the minimum value, even when the composite substrate 10 was processed by a high-temperature treatment at 300° C., no cracks were generated; however, on the other hand, when bonding was performed so that the in-plane maximum thermal strain amount SH had the maximum value, by a high-temperature treatment at the same temperature as described above, cracks were generated. When the in-plane maximum thermal strain amount SH had the minimum value, the reduction rate from the maximum value was 20%. In addition, when the two substrates 12 and 14 were bonded to each other so that the in-plane maximum thermal strain amount SH was reduced by 10% with respect to the maximum value, no cracks were also generated.

Accordingly, in order to suppress the generation of cracks, the value of the angle φ is not important, and it is important that when one of the two substrates 12 and 14 is rotated with respect to the other, the maximum value and the minimum value of the in-plane maximum thermal strain amount SH are obtained, and that the piezoelectric substrate 12 and the support substrate 14 are bonded to each other to have a positional relationship in which the in-plane maximum thermal strain amount SH is set in the range of from the minimum value to a value obtained by reducing the maximum value by a reduction rate of 10%.

Example 2

Figure 6:
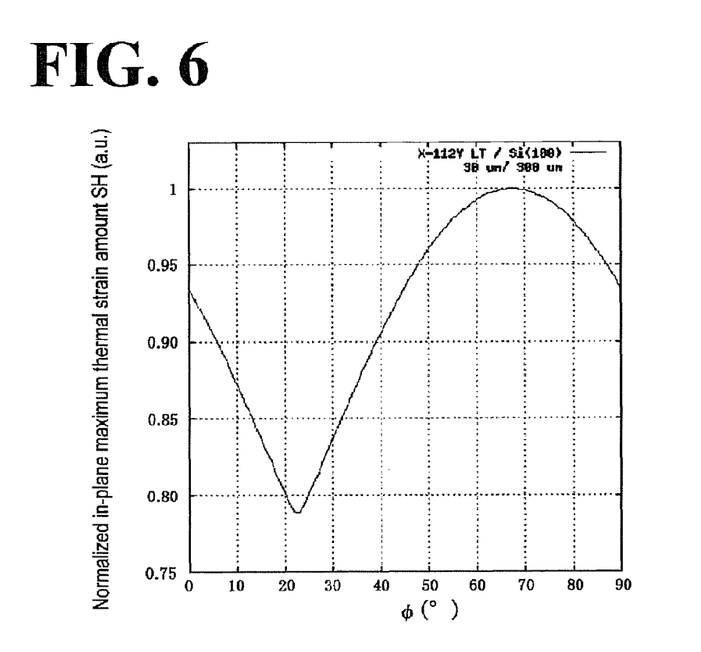
FIG. 6 is a graph showing variation in in-plane maximum thermal strain amount SH against angle φ in Example 2.

A composite substrate 10 of Example 2 was similar to that of Example 1 except that an X-cut 112° Y-transmission LT substrate (X-112Y LT) was used as the piezoelectric substrate 12. In Example 2, FIG. 6 shows the way of change in in-plane maximum thermal strain amount SH which was obtained when the above simulation (see Equation 1) was performed in which the thickness of the support substrate 14 was set to 350 μm and the thickness of the piezoelectric substrate 12 was set to 30 μm. As apparent from FIG. 6, the in-plane maximum thermal strain amount SH had the maximum value and the minimum value, and the minimum value of the in-plane maximum thermal strain amount SH was reduced by 21% to 22% as compared to the maximum value thereof.

Example 3

Figure 7:
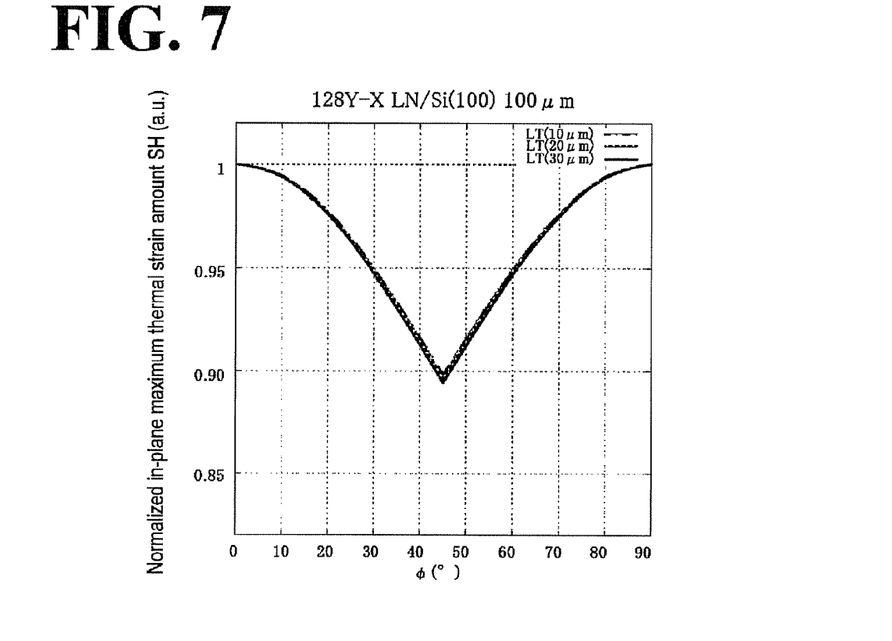
FIG. 7 is a graph showing variation in in-plane maximum thermal strain amount SH against angle φ in Example 3.

A composite substrate 10 of Example 3 was similar to that of Example 1 except that a 128° Y-cut X-transmission lithium niobate (LN) substrate (128Y-X LN) was used as the piezoelectric substrate 12. In Example 3, FIG. 7 shows the way of change in in-plane maximum thermal strain amount SH which was obtained when the above simulation (see Equation 1) was performed in which the thickness of the support substrate 14 was set to 100 μm and the thickness of the piezoelectric substrate 12 was set to 10 μm, 20 μm, and 30 μm. As apparent from FIG. 7, the in-plane maximum thermal strain amount SH had the maximum value and the minimum value, and the minimum value of the in-plane maximum thermal strain amount SH was reduced by 10% to 11% as compared to the maximum value thereof. In addition, when the simulation was performed in a manner similar to that described above in which the thickness of the support substrate 14 was set to 200 μm and 300 μm, a graph similar to that of FIG. 7 was obtained.

Example 4

Figure 8:
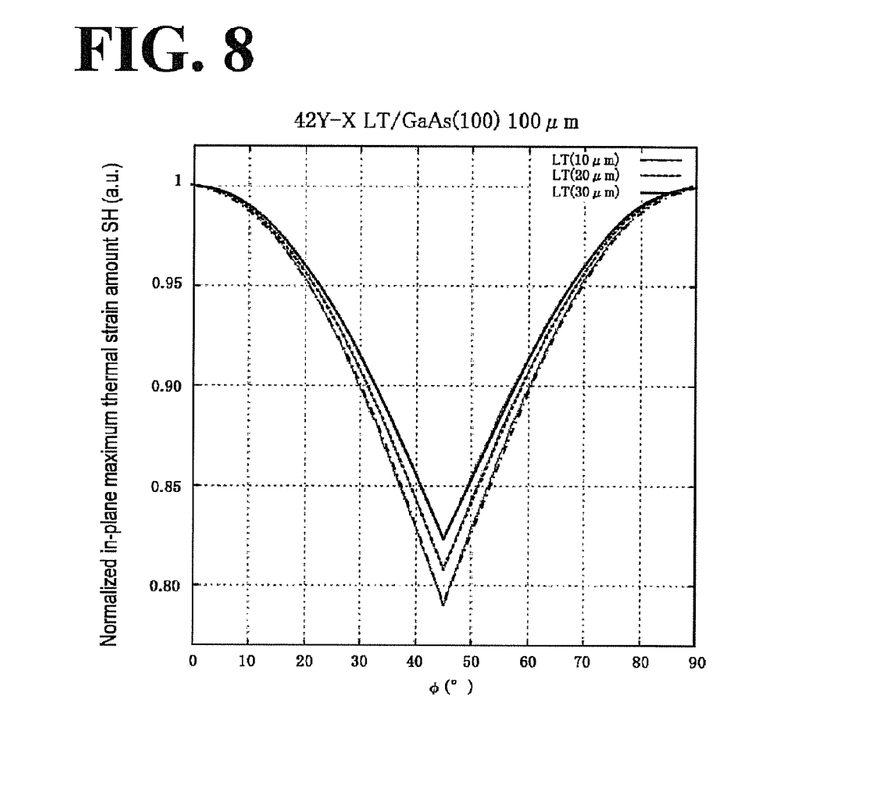
FIG. 8 is a graph showing variation in in-plane maximum thermal strain amount SH against angle φ in Example 4.

A composite substrate 10 of Example 4 was similar to that of Example 1 except that a GaAs substrate having the (100) plane direction was used as the support substrate 14. In Example 4, FIG. 8 shows the way of change in in-plane maximum thermal strain amount SH which was obtained when the above simulation (see Equation 1) was performed in which the thickness of the support substrate 14 was set to 100 μm and the thickness of the piezoelectric substrate 12 was set to 10 μm, 20 μm, and 30 μm. As apparent from FIG. 8, the in-plane maximum thermal strain amount SH had the maximum value and the minimum value, and the minimum value of the in-plane maximum thermal strain amount SH was reduced by 17% to 22% as compared to the maximum value thereof. In addition, when the simulation was performed in a manner similar to that described above in which the thickness of the support substrate 14 was set to 200 μm and 300 μm, a graph similar to that of FIG. 8 was obtained.

Example 5

Figure 9:
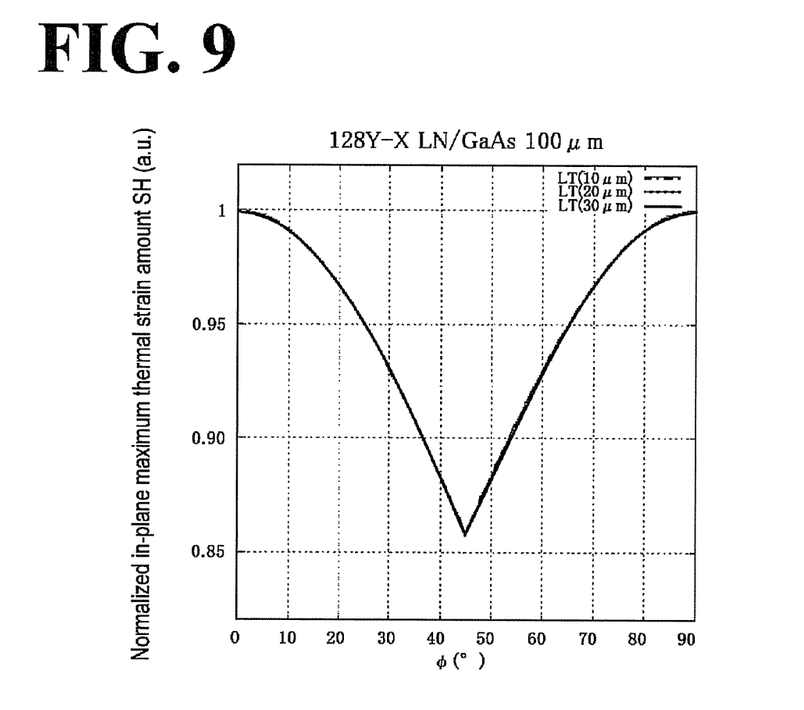
FIG. 9 is a graph showing variation in in-plane maximum thermal strain amount SH against angle φ in Example 5.

A composite substrate 10 of Example 5 was similar to that of Example 1 except that a 128° Y-cut X-transmission LN substrate (128Y-X LN) was used as the piezoelectric substrate 12 and a GaAs substrate having the (100) plane direction was used as the support substrate 14. In Example 5, FIG. 9 shows the way of change in in-plane maximum thermal strain amount SH which was obtained when the above simulation (see Equation 1) was performed in which the thickness of the support substrate 14 was set to 100 μm and the thickness of the piezoelectric substrate 12 was set to 10 μm, 20 μm, or 30 μm. As apparent from FIG. 9, the in-plane maximum thermal strain amount SH had the maximum value and the minimum value, and the minimum value of the in-plane maximum thermal strain amount SH was reduced by approximately 14% as compared to the maximum value thereof. In addition, when the simulation was performed in a manner similar to that described above in which the thickness of the support substrate 14 was set to 200 μm and 300 μm, a graph similar to that of FIG. 9 was obtained.

The present application claims priority from the Japanese Patent Application No. 2009-075048 filed on Mar. 25, 2009, the entire contents of which are incorporated herein by reference.

What is claimed is:

1. A composite substrate for a surface acoustic wave device, the composite substrate comprising:
    a piezoelectric substrate having anisotropy and which is capable of transmitting an elastic wave; and
    a support substrate having anisotropy and having a smaller thermal expansion coefficient than that of the piezoelectric substrate, and which is bonded thereto;
    wherein an in-plane maximum thermal strain amount, which is the largest thermal strain amount in the plane of the composite substrate, has a minimum value and a maximum value when the piezoelectric substrate and the support substrate are relatively rotated 0° to 360°; and
    wherein an entire surface of one surface of the piezoelectric substrate is bonded with an entire surface of one surface of the support substrate, and the piezoelectric substrate and the support substrate are thereby bonded directly or indirectly via an organic adhesive layer interposed therebetween, to each other so that the in-plane maximum thermal strain amount has the minimum value or a value in the vicinity thereof.

2. The composite substrate according to claim 1,
    wherein the piezoelectric substrate is made of a material selected from the group consisting of lithium tantalate, lithium niobate, single crystal of lithium niobate-lithium tantalate solid solution, quartz, lithium borate, zinc oxide, aluminum nitride, langasite (LGS), and langatate (LGT); and
    wherein the support substrate is made of a material selected from the group consisting of silicon, sapphire, gallium arsenide, gallium nitride, and quartz.

3. An elastic wave device that is produced using the composite substrate according to claim 1.

4. A composite substrate for a surface acoustic wave device, the composite substrate comprising:
    a piezoelectric substrate having anisotropy and which is capable of transmitting an elastic wave; and
    a support substrate having anisotropy and having a smaller thermal expansion coefficient than that of the piezoelectric substrate, which is bonded thereto;
    wherein an in-plane maximum thermal strain amount, which is the largest thermal strain amount in the plane of the composite substrate, has a minimum value and a maximum value when the piezoelectric substrate and the support substrate are relatively rotated 0° to 360°; and
    wherein an entire surface of one surface of the piezoelectric substrate is bonded with an entire surface of one surface of the support substrate, and the piezoelectric substrate and the support substrate are thereby bonded directly or indirect via an organic adhesive layer interposed therebetween, to each other so that the in-plane maximum thermal strain amount is in the range of from the minimum value to a value obtained by reducing the maximum value by 10%.

5. The composite substrate according to claim 4,
    wherein the piezoelectric substrate is made of a material selected from the group consisting of lithium tantalate, lithium niobate, single crystal of lithium niobate-lithium tantalate solid solution, quartz, lithium borate, zinc oxide, aluminum nitride, langasite (LGS), and langatate (LGT); and wherein the support substrate is made of a material selected from the group consisting of silicon, sapphire, gallium arsenide, gallium nitride, and quartz.

6. An elastic wave device that is produced using the composite substrate according to claim 4.

7. A method of manufacturing a composite substrate for a surface acoustic wave device, the method comprising a step of bonding a piezoelectric substrate having anisotropy, and which is capable of transmitting an elastic wave, to a support substrate having anisotropy and having a smaller thermal expansion coefficient than that of the piezoelectric substrate;

wherein an in-plane maximum thermal strain amount of the composite substrate, which is the largest thermal strain amount in the plane of the composite substrate, has a minimum value and a maximum value when the piezoelectric substrate and the support substrate are relatively rotated 0° to 360°; and wherein an entire surface of one surface of the piezoelectric substrate is bonded with an entire surface of one surface of the support substrate, and the piezoelectric substrate and the support substrate are thereby bonded directly or indirectly via an organic adhesive layer interposed therebetween, to each other so that the in-plane maximum thermal strain amount has the minimum value or a value in the vicinity thereof.

\* \* \* \* \*